United States Patent [19]
Parris

[11] Patent Number: 5,331,601
[45] Date of Patent: Jul. 19, 1994

US005331601A

[54] DRAM VARIABLE ROW SELECT

[75] Inventor: Michael C. Parris, Colorado Springs, Colo.

[73] Assignees: United Memories, Inc., Colorado Springs, Colo.; Nippon Steel Semiconductor Corp., Chiba, Japan

[21] Appl. No.: 13,333

[22] Filed: Feb. 4, 1993

[51] Int. Cl.$^5$ .............................................. G11C 8/00
[52] U.S. Cl. ........................ 365/230.08; 365/230.06; 365/222; 365/227; 365/228; 365/189.05
[58] Field of Search ............... 365/230.06, 230.08, 365/233.5, 222, 227, 228, 189.05, 238.5

[56] References Cited
U.S. PATENT DOCUMENTS 4,989,183 1/1991 Kumanoya et al. ............... 365/222

*Primary Examiner*—Eugene R. LaRoche
*Assistant Examiner*—Andrew Q. Tran
*Attorney, Agent, or Firm*—Edward D. Manzo; David K. Lucente

[57] ABSTRACT

A memory device circuit that alters the input refresh addresses to access fewer memory cells to save power, or to address more memory cells to decrease the refresh time. The circuit contains a simple transistor configuration that blocks certain address bits, then substitutes active bits in their place to the address decoder. The circuit also includes a controller that is responsive to the memory device entering the refresh mode. When the device is used in refresh mode, the address bits may be passed unblocked to the address decoder for full user control.

19 Claims, 12 Drawing Sheets

DRAM VARIABLE ROW SELECT

FIELD OF THE INVENTION

The present invention relates to a memory address select circuit and, more particularly, to a variable dynamic random access memory ("DRAM") row select circuit for either low power refresh and/or fast refresh of memory data.

BACKGROUND OF THE INVENTION

DRAMs are dynamic memory devices that store data by electrical charge. The electrical charge representing stored data has to be restored after it is read. The data also has to be refreshed periodically, even when the data is not read, because the charge representing the data dissipates.

A large part of the current that a DRAM uses is in refreshing the memory cells. The current used is determined by how many cells are refreshed at one time. Every cell along a selected row is refreshed periodically. When a cell is refreshed, the corresponding bit line lines are either pulled to a reference voltage, usually ground, or a power supply voltage (VCC).

For example, in a DRAM the "battery back-up mode," sometimes known as self-refresh mode, is a cycle that the system uses to save power. The system is not accessing (reading) any cells; it just maintains the data in the DRAM. This mode uses as little power as required to maintain the data in the memory cells. Other refresh modes are column address strobe before row address strobe (known in the art as "CAS before RAS") and suspend mode.

FIG. 8 represents a conventional memory array configuration with associated row decoders and row address buffers. The memory array is divided into four subarrays 200. Each subarray represents one-quarter of the storage capacity of the total memory. For example, if the total memory is four megabits ($2^{22}=4,194,304$), then each subarray 200 would be 1 megabit ($2^{20}=1,048,576$) configured to have 1,024 columns and 1,024 rows. Each subarray 200 has a corresponding decoder 202. Decoders 202 are coupled to address buffers 204 which receive row addresses.

The subarrays are accessed by the user or system by supplying a row address to address buffers 204. Address buffers 204 pass buffered row addresses to decoders 202. Selected ones of decoders 202 supply decoded row addresses to the corresponding subarrays 200. Since each subarray 200 has 1,024 rows, the corresponding decoder 202 provides one of 1024 decoded row addresses. The address is provided from decoders 202 to subarrays 200 via word lines 205 i.e. by raising the voltage on the selected word line(s).

FIG. 9 shows a more detailed diagram of the subarrays 200 and decoders 202 in a block 206 in FIG. 8, and the address buffers 204 in a block 204. As illustrated in a block 200 of block 206 of FIG. 9, each subarray 200 is broken down into further subarrays ("SA") 208. Subarrays 208 a–d represent one subarray 200 and subarrays 208e–h represent another subarray 200. Hence, FIG. 9 depicts two subarrays 200 of FIG. 8 for a total memory capacity of 2 megabits ($2^{21}=2,097,157$).

A block 202 in FIG. 9 shows a decoder 202 of FIG. 8 in more detail. Block 202 contains subarray decoders ("SAD") 210a–d and predecoders ("PD") 212a–d. A block 204 shows in more detail address buffers 204 of FIG. 8 to include low address buffers 204a and high address buffers 204b.

The operation of the FIG. 9 configuration will be explained in terms of addressing the subarrays 208a–h. First a row address is supplied to low and high address buffers 204a and b. Since each subarray 200 has 1,024 rows, the row address must have ten address bits (A0–9). It follows that each subarray 208a–h has 256 kilobits of memory.

Low address buffers 204a receive the first eight (lower) address bits A0–7. High address buffers 204b receive the two high address bits A8–9. Address bits A0–9 are supplied to predecoders 212a–d. High address bits A8–9 are typically used to enable by selection predecoders 212a–d. Two high address bits (A8–9) select one predecoder 212 out of four in each 1 megabit block. The selected predecoder 212 passes the low address bits to its corresponding subarray decoder 210 to be decoded.

In the corresponding subarray 208, a row will be accessed corresponding to the word line activated by the decoded low address bits A0–7. The row of subarray 208 corresponding to the activated word line can then be accessed and refreshed. Each of the four subarrays 200 of FIG. 8 has a respective one of its rows accessed. Hence, four rows will be accessed for the entire memory in response to a received row address.

FIG. 1 shows a typical configuration of row address buffer and decoder circuits. Input buffers circuit 10 is coupled to receive an address signal A0–AN. A buffers latch circuit 12 is coupled to receive an output signal from circuit 10 via a bus 14. A buffers output enable circuit 16 is coupled to receive an output signal from circuit 12 via a bus 18. An address decoder circuit 20 is coupled to receive an output signal from circuit 16 via a bus 22. Address decoder circuit 20 outputs a word line enabling signal WL0-WLM via a bus 24.

The FIG. 1 row address circuit receives an address signal A0–AN from a bus or a device such as an external processor or memory controller. Input buffers circuit 10 converts the address signal to CMOS levels. For example, if address signal A0–AN is a TTL signal with a high level (2.4 V) and a low level (0.8 V), it will be converted to a CMOS high level (5.0 V) and low level (0.0 V).

Latch circuit 12 receives from input buffers circuit 10 a buffered or converted address signal A0–AN. Latch circuit 12 latches the address signal A0–AN in latches (not shown) and provides complementary bits of the address signal A0–AN. Latch circuit 12 provides the latched address signal to buffers output enable circuit 16. Circuit 16 outputs the latched address input signal and its complements to address decoder circuit 20. Circuit 20 decodes the latched address signal and outputs memory enabling signal WL0–WLM to the memory array (not shown).

FIG. 2 is a detailed schematic of the FIG. 1 circuit. FIG. 2 illustratively shows a three-bit address (N=2), and an 8-bit output (M=7). Address bits A0–A2 are input to block 10, which represents the input buffers circuit 10 shown in FIG. 1. Input buffers 11a, 11b, and 11c (collectively "buffers 11") represent individual buffers of circuit 10. Outputs of buffers 11 are respectively provided on lines 14a, 14b and 14c, which are the individual lines of bus 14 in FIG. 1. Lines 14a, 14b and 14c are input to block 12, which represents the buffers latch circuit 12 shown in FIG. 1. Lines 14a, 14b and 14c are respectively coupled to source-drain paths of pass transistors 26a, 26c and 26e (collectively "pass transistors 26"). Lines 14a, 14b and 14c are also respectively coupled to source-drain paths of pass transistors 26b, 26d and 26f (collectively "pass transistors 26") through inverters 28a, 28b and 28c (collectively "inverters 28"), respectively. Inverters 28 provide complements of address signals A2-A0. Gate electrodes of the aforementioned pass transistors 26 are coupled to receive an address transfer signal ADDXFER.

The source-drain paths of pass transistors 26a and 26b, 26c and 26d, and 26e and 26f are respectively coupled to inverters 30a and 30b, 30c and 30d, and 30e and 30f (collectively "inverters 30"). The source-drain paths of pass transistors 26 are respectively coupled to lines 18a, 18b, 18c, 18d, 18e and 18f. Lines 18a, 18b, 18c, 18d, 18e and 18f are the individual lines of bus 18 as shown in FIG. 1.

Lines 18a, 18b, 18c, 18d, 18e and 18f are input to a block 16 which represents the buffers output enable circuit 16 of FIG. 1. Lines 18a, 18b, 18c, 18d, 18e and 18f are coupled to first inputs of NAND gates 32a, 32b, 32c, 32d, 32e and 32f (collectively "NAND gates 32"), respectively. Second inputs of NAND gates 32 are each coupled to receive an address buffer enable signal ABE. Inverters 34a, 34b, 34c, 34d, 34e and 34f (collectively "inverters 34") are coupled to receive outputs of NAND gates 32, respectively. Outputs of inverters 34 are respectively provided on lines 22a, 22b, 22c, 22d, 22e and 20f (collectively "lines 22"). Lines 22a, 22b, 22c, 22d, 22e and 22f are individual lines of bus 22 as shown in FIG. 1.

Lines 22 a-f are input to a block 20 which represents the address decoder circuit 20 as shown in FIG. 1. It is formed illustratively of NAND gates, each having three inputs. It will be understood, however, that other logic circuitry could be used, such as AND gates. In FIG. 2, NAND gates 36a, 36b, 36c, 36d, 36e, 36f, 36g and 36h (collectively "NAND gates 36") have inputs that are coupled to various combinations of lines 22. NAND gates 36 decode signals on lines 22 to generate a row address (identify a row) to be accessed in the memory (not shown). Inverters 38a, 38b, 38c, 38d, 38e, 38f, 38g and 38h (collectively "inverters 38") are coupled to receive outputs of respective NAND gates 36. Inverters 38 provide word line enabling signals WL0-WL7 on respective lines 24a, 24b, 24c, 24d, 24e, 24f, 24g and 24h. Lines 24a, 24b, 24c, 24d, 24e, 24f, 24g and 24h are the individual lines of bus 24 shown in FIG. 1.

Buffer 11a, inverters 28a, 30a, 30b, 34a and 34b, NAND gates 32a and 32b, and pass transistors 26a and 26b form an address A2 buffer for address bit A2. Address bits A0 and A1 have respective buffers that are configured like the devices of the address A2 buffer. Hence, FIG. 2 illustrates three address buffers.

The operation of the FIG. 2 will now be explained. Address signals A0-A2 are input with, for example, a value 1,0,1 (A0=1, A1=0, A2=1) to their respective buffers 11. Buffers 11 supply address signals A0-A2 to respective pass gates 26, either directly or through inverters 28. Inverters 28 supply the complements of address signals A0-A2, i.e. A0\(=0), A1\(=1) and A2\(=0).

Address transfer signal ADDXFER becomes active (high) to turn on pass transistors 26 to supply address signals A0-A2 and A0\-A2\to inverters 30. Inverters 30 function as a latch to maintain the address signals A0-A2 and A0\-A2\. Pass transistors 26 also supply address signals A0-A2 and A0\-A2\to NAND gates 32 via lines 18a, 18b, 18c, 18d, 18e and 18f (respectively 1,0,0,1,1,0). NAND gates 32 pass complements of address signals A0-A2 and A0\-A2\to inverters 34 when address buffer enable signal ABE is active (high). The outputs of NAND gates 32a, 32b, 32c, 32d, 32e and 32f are respectively 0,1,1,0,0,1.

Inverters 34 complement the outputs of NAND gates 32 to provide address signals A0-A2 and A0\-A2\ to NAND gates 36 to be decoded. The outputs of inverters 34a, 34b, 34c, 34d, 34e and 34f are respectively 1,0,0,1,1,0. NAND gates 36 decode address signals A0-A2 and A0\-A2\to provide decoded signals to inverters 38. Inverters 38 complement (invert) the outputs of NAND gates 36 to provide enabling signals WL0-WL7. It can be seen from FIG. 2, block 20, that enabling signals WL0, WL1, WL2, WL3, WL4, WL5, WL6 and WL7 have respective values of 0,0,0,0,0,1,0,0 when A0=1, A1=0 and A2=1. The circuit of FIG. 2 refreshes a row of memory cells according to the address that is supplied from buffers 11.

Many DRAMs are manufactured by an advanced process technology that allows the device to hold data longer than other process technologies allow. The longer data holding time can be taken advantage of by restoring fewer rows at a time, thus saving power. Further, other DRAMs may be fabricated via processes where less power is required to restore the data memory. These devices can have more rows restored without prohibitively increasing the power requirements of the device.

For example, using a 64 megabit DRAM manufacturing process for a one megabit DRAM would lessen the power requirements to restore the data because the geometries of the former devices are smaller than those of the latter devices. The typical row address circuit explained above and shown in FIGS. 1 and 2 does not take advantage of these superior processes.

Additionally, industry standards dictate such requirements as, for example, the number of rows a given generation of DRAMS will have. This makes all DRAM devices somewhat uniform regardless of the manufacturer. A user can employ DRAMs made by different manufacturers knowing that they will have the same specifications, such as the same page size. Therefore, any alterations to the functions of DRAMs must be transparent to the user.

Therefore, it is a general object of the present invention to provide a circuit which allows a DRAM to save power while refreshing, or to refresh more quickly, and still conform to industry standards.

A further object of the present invention is to provide a circuit to save power for refreshing a DRAM that requires a minimum number of devices, and thus requires a small area.

A still further object of the present invention is to provide a circuit to decrease and/or increase the number of rows refreshed regardless of the circuitry used to input the address.

SUMMARY OF THE PRESENT INVENTION

This invention provides a variable bit select circuit and method for low power or fast refresh modes for a DRAM. Preferably, the circuit is responsive to a DRAM entering refresh mode to control the multiplexing of an address bit(s) with a predetermined value to an address decoder. Depending on the process used to manufacture the DRAM, fewer rows may be refreshed to save power. Or, more rows would be refreshed than normal to shorten the time required for a refresh cycle. In the preferred embodiment, the phrase, "variable bit select" has reference to a method and/or apparatus for selectively varying one or more address bits of a multiple-bit address signal for choosing one or more rows of arrayed memory cells. Preferably, such varying of the address bit (or bits) is based on the state of a control signal that corresponds to a mode of operation of the memory. The address bit(s) may be provided illustratively by one or more refresh counters or by an external source of addresses, e.g. a user.

A preferred embodiment of the present invention includes a selection transistor/pull-up transistor configuration and various control logic to be implemented with an address buffer.

A novel and important aspect of the operation of such circuit is its ability to alter the number of accessed addresses of a memory device during refresh modes either to reduce the number of accessed addresses to save power, or to increase the number of accessed addresses to increase the speed of the refresh mode, regardless of the circuitry providing the addresses.

Another important aspect of such circuit is that it is invisible to the user, i.e. the circuit does not alter the function of the DRAM when interfaced by the user, as required by industry standards.

The invention also includes a method for operating a variable row select circuit. A method of operating the circuit may comprise the steps of: (1) operating switches to determine whether the DRAM is to be refreshed in a normal, low power or fast mode; (2) detecting accesses to the DRAM to determine the addresses to be accessed; and (3) accessing the DRAM according to the mode of refresh.

Another method of operating the circuit may comprise the steps of: (1) passing all address bits responsive to a first state of a control signal; (2) blocking at least one of the address bits responsive to a second state of the control signal; and (3) substituting a signal for the blocked address bit.

BRIEF DESCRIPTION OF THE DRAWINGS

The invention, together with its objects and the advantages thereof, may best be understood by reference to the following detailed description taken in conjunction with the accompanying drawings of which.

DETAILED DESCRIPTION OF THE INVENTION

Figure 1:
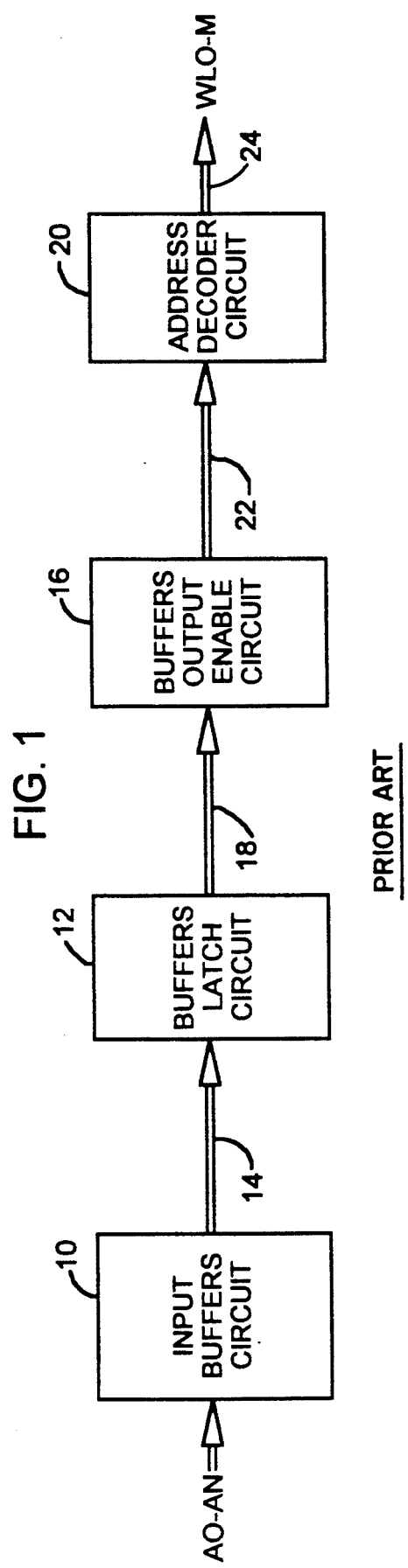
FIG. 1 is a block diagram of a circuit including typical row address buffer and address decoder circuits.
Figure 3:
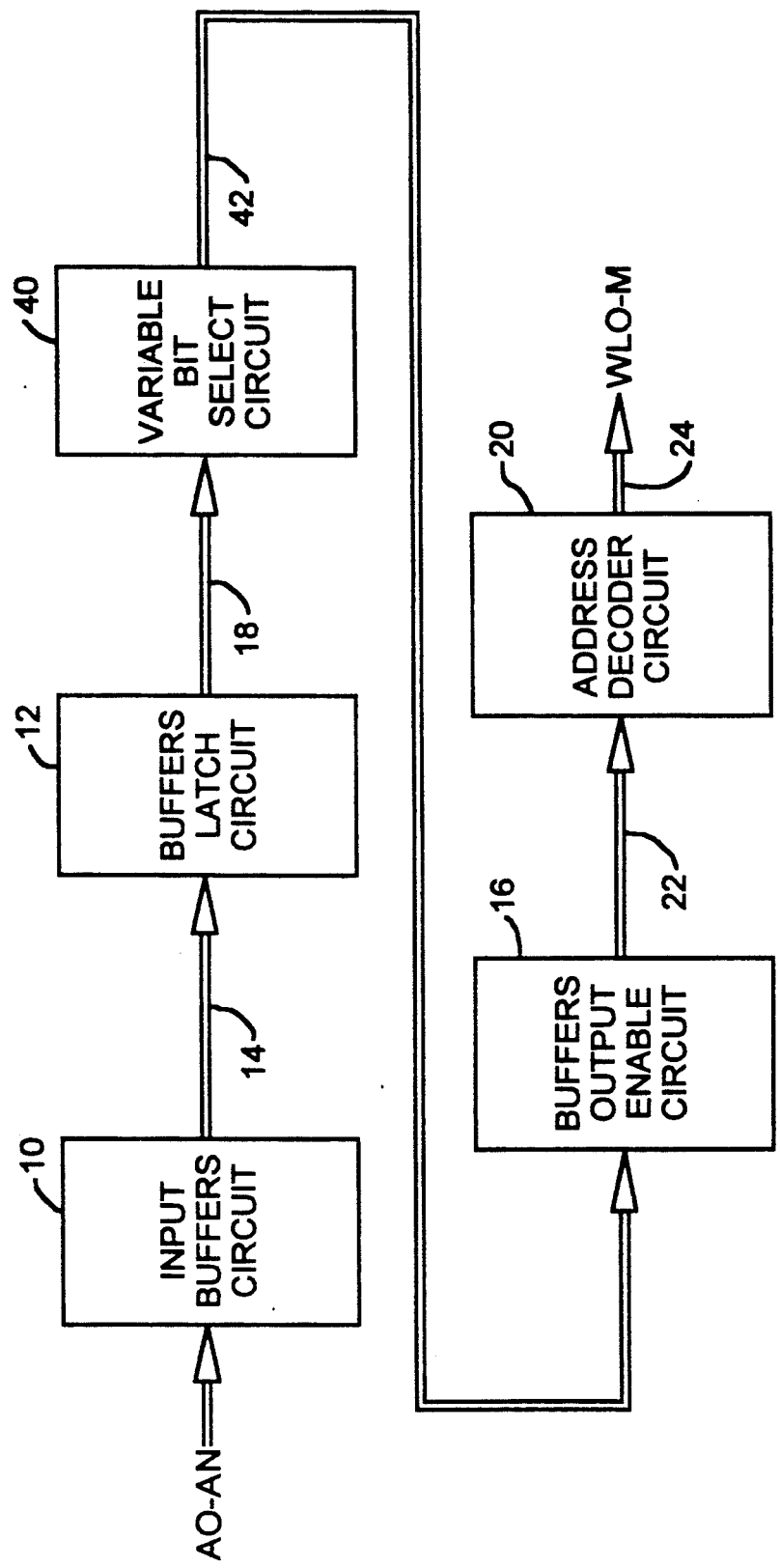
FIG. 3 is a block diagram of a circuit according to the present invention.

FIG. 3 is a block diagram of a circuit according to the present invention. Blocks in FIG. 3 that are the same as blocks in FIG. 1 are designated by the same numbers. According to the present invention, a variable bit select circuit 40 is preferably interposed between buffers latch circuit 12 and buffers output enable circuit 16. Variable bit select circuit 40 is coupled to receive signals via bus 18. Variable address select circuit 40 outputs a variable address signal to circuit 16 via a bus 42.

Variable bit select circuit 40 will either pass the latched address signal from buffers latch circuit 12 or block certain address bits of the latched address signal and substitute active bits. The substituted active bits with the other nonblocked latched address bits will decode into more active enabling signals WL0–WLM.

Figure 2:
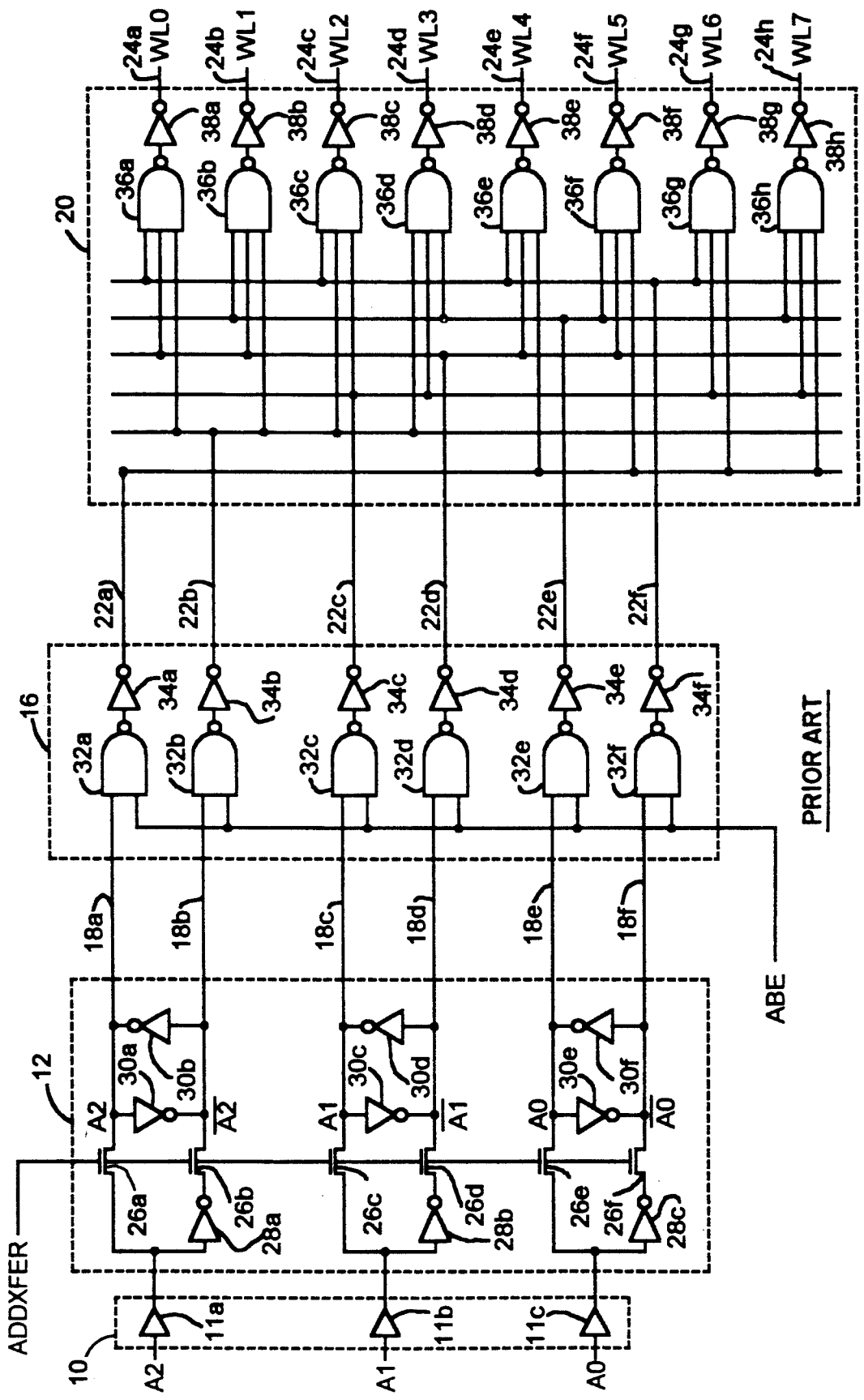
FIG. 2 is a detailed diagram of the FIG. 1 row address buffer and address decoder.
Figure 4:
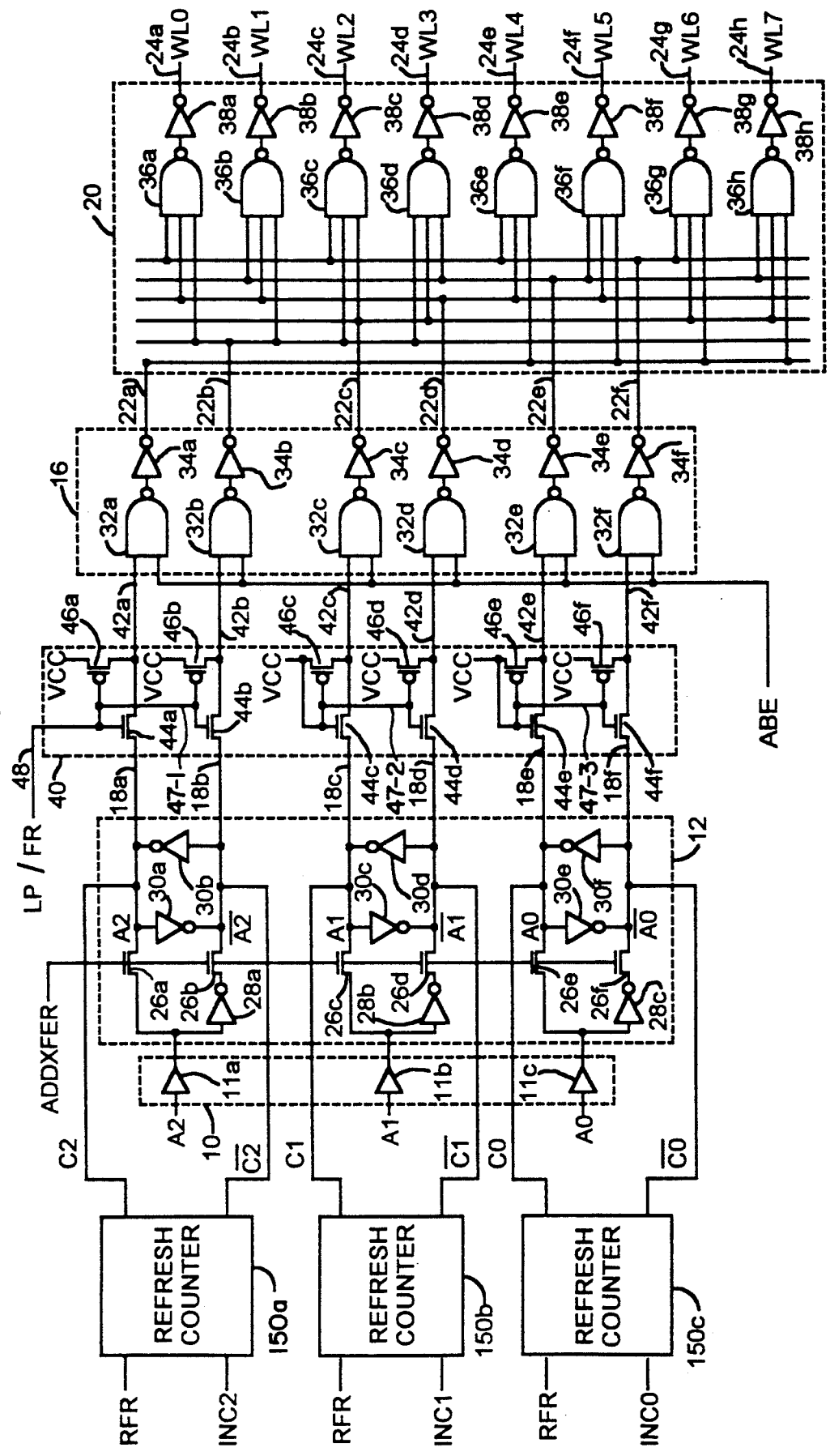
FIG. 4 is a first embodiment of the FIG. 3 diagram.

FIG. 4 is a first embodiment of the FIG. 3 diagram. Devices in FIG. 4 that are the same as devices in FIG. 2 are designated by the same numbers. Selection transistors 44a, 44b, 44c, 44d, 44e and 44f (collectively "selection transistors 44") are illustratively n-channel enhancement mode FETs. Each one has a respective terminal of its source-drain path coupled to the source-drain path of a corresponding pass transistor 26 via a respective line 18a, 18b, 18c, 18d, 18e or 18f. Each selection transistor 44 has another terminal of its source-drain path coupled to an input of a respective NAND gate 32 via a respective line 42a, 42b, 42c, 42d, 42e or 42f. Lines 18 are coupled to refresh counters 150, explained infra.

A plurality of pull-up transistors 46a, 46b, 46c, 46d, 46e and 46f (collectively "pull-up transistors 46") are provided. They have their source-drain paths coupled between respective lines 42a, 42b, 42c, 42d, 42e and 42f and a power supply that provides a voltage VCC. Illustratively, transistors 46 are p-channel FETs.

Transistors 44 a–f and 46 a–f are grouped together in the sense that three groups of four transistors have their gate electrodes coupled together. Specifically, the gate electrodes of selection transistors 44a and 44b and pull-up transistors 46a and 46b are coupled together at a first node 47-1. Node 47-1 is coupled to receive a low power/fast refresh signal LP/FR via a line 48 coupled to a variable bit select controller 50 (shown in FIG. 5 and explained infra). The combination of the selection transistors 44a and 44b with pull-up transistors 46a and 46b provides or constitutes a block/pass element of variable address select circuit 40.

A second node 47-2 is coupled to the gate electrodes of selection transistors 44c and 44d, and pull-up transistors 46c and 46d. Node 47-2 is coupled to receive voltage VCC at the source electrode of p-channel FET 46c. A third node 47-3 is coupled to the gate electrodes of selection transistors 44e and 44f and pull-up transistors 46e and 46f. Node 47-3 is coupled to receive voltage VCC at the source electrode of p-channel FET 46e.

The configuration of selection transistors 44c and 44d, pull-up transistors 46c and 46d, and selection transistors 44e and 44f, and pull-up transistors 46e and 46f maintains selection transistors 44c–f turned on and pull-up transistors 46c–f turned off. This configuration allows address bits A0 and A1 and their complements to pass without being blocked to NAND gates 32c–f.

Selection transistors 44c-f and pull-up transistors 46c-f may be removed from the FIG. 4 embodiment. The advantage of including them in the FIG. 4 embodiment is that each address buffer uses the same layout. This would save design time and cost. The advantage of eliminating selection transistors 44c-f and pull-up transistors 46c-f would be a lower device population, i.e. fewer devices. Fewer devices translates into less area required, less heat generated, less power consumed, etc.

The operation of the FIG. 4 embodiment will now be explained. It will be understood that the FIG. 4 embodiment can be configured in at least two ways. First, the embodiment can be configured where it can be used selectively for a normal refresh mode or a low power refresh mode. An alternative configuration allows selection between a normal refresh mode or a fast refresh mode. In these two configurations, the user or system provides the address bits for normal refresh mode. For low power and fast refresh modes, refresh counters 150 provide count bits to address the memory array.

Assume that address bits A0A1A2 have input values of 1,0,1 (A0=1, A1=0, A2=1). While in normal refresh mode, the FIG. 4 embodiment may operate the same way as the FIG. 2 circuit to provide, on lines 18a, 18b, 18c, 18d, 18e and 18f, the values 1(A2), 0(A\2), 0(A1), 1(A1\), 1(A0), 0(A0\) respectively. Because of the configurations of transistors 44c, d, e, and f, and 46c, d, e and f, address bits A1 and A1\, and A0 and A0\or count bits C0 and C0\and C1 and C1\on respective lines 18c-f will pass without being blocked through their corresponding selection transistors 44c-f to NAND gates 32c-f via lines 42c-f.

Whether address bits A2 and A2\reach buffers output enable circuit block 20 depends on the signal LP/FR on line 48. Briefly, variable bit select controller 50 in FIG. 5 can be configured for a normal or a low power refresh of the FIG. 4 embodiment. When output signal LP/FR has a high voltage, this represents low power refresh mode; a low voltage represents normal refresh mode. In this configuration, address buffer A2 is preferably not connected externally to the user or system.

If signal LP/FR is high while address bits A0-2 have a value of 1,0,1, selection transistors 44a and 44b turn on, and pull-up transistors 46a and 46b turn off. This allows the signals on lines 18a and 18b to be passed to NAND gates 32a and 32b in circuit 20 via lines 42a and 42b. The values on lines 42a-f are subsequently gated (when address buffer enable signal ABE becomes active) and decoded in block 20. The decoded address will cause enabling signal WL5 to be active (high), as explained for the FIG. 2 circuit.

When signal LP\FR is low (normal refresh mode), selection transistors 44a and 44b turn off, and pull-up transistors 46a and 46b turn on. Turning off transistors 44a and 44b blocks the signal on lines 18a and 18b. Instead, pull-up transistors 46a and 46b pull up lines 42a and 42b to a preferred high voltage (active). These high voltages are passed to NAND gates 32a and 32b in circuit. The values on lines 42a-f are subsequently gated (when address buffer enable signal ABE becomes active) and decoded in block 20. Subsequently, word line enabling signals WL1 and WL5 become active (high).

Figure 5:
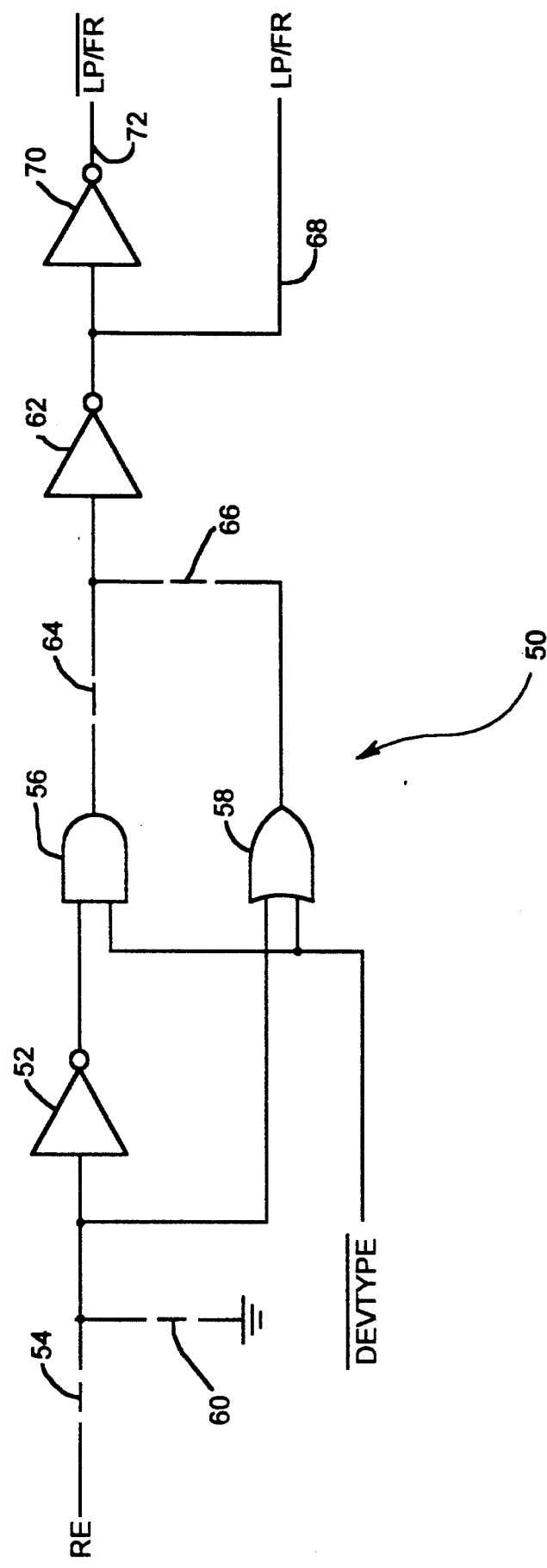
FIG. 5 shows the variable bit select controller of FIG. 4.

Variable bit select controller 50 in FIG. 5 can be configured (explained infra) for normal and fast refresh modes when refresh enable signal RE is active. In this configuration, it is preferred that a refresh counter 150 is not coupled to lines 18a and 18b. For the case where signal LP/FR is high (normal refresh mode), n-channel selection transistors 44a and 44b are on, which passes the signals on lines 18a and 18b to NAND gates 32a and 32b via lines 42a and 42b. Pull-up p-channel transistors 46a and 46b are off to decouple lines 42a and 42b from the power supply.

When signal LP/FR is low (fast refresh mode), selection transistors 44a and 44b are turned off to block address bits A2 and A2\. Pull-up transistors 46a and 46b are turned on to pull up lines 42a and 42b to VCC. As can be determined from the configuration of block 20, enabling signals WL1 and WL5 become active. Twice as many row addresses are accessed than for the normal refresh mode.

To summarize, when selection transistors 44a and 44b are turned on, and pull-up transistors 46a and 46b are turned off, the address buffer is enabled to pass the signal on lines 18a and 18b either input address bits or count bits—to output enable circuit 16 and then—address decoder circuit 20. Either line 22a or 22b will be high, but not both. However, when selection transistors 44c and 44b are off, and pull-up transistors 46a and 46b are on, and the input bits on lines 18a, b are blocked. Not just one but two high values are provided on lines 22a, b to address decoder circuit 20, thereby to select twice as many row addresses.

Variable bit select controller 50, which provides the control 18 signal LP/FR, will be explained in detail by referring to FIG. 5. An inverter 52 is selectively coupled through a connection 54 to receive a refresh enable signal RE. Connections 54, 60, 64 and 66 shown in FIG. 5 are preferably metallic connections made during the fabrication of the FIG. 5 circuit. Once the connections are made during fabrication, they are permanent and set circuit 50 to one type of refresh mode. A logic gate 56, illustratively an AND gate, is coupled to receive an output of inverter 52. AND gate 56 is also coupled to receive a device signal DEVTYPE\. Device signal DEVTYPE\ determines (corresponds to) the type of memory device, i.e. whether it will refresh a greater or fewer number of rows than a nominal or standard number.

A logic gate 58, illustratively an OR gate, is coupled to receive device signal DEVTYPE\OR gate 58 is selectively coupled through connection 54 to receive refresh signal RE. An inverter 62 is selectively coupled through a connection 64 to receive an output of AND gate 56. Inverter 62 is selectively coupled through a connection 66 to receive an output of OR gate 58.

Low power/fast refresh signal LP/FR is outputted on a line 68 as an output of inverter 62. An inverter 70 is coupled to receive signal LP/FR. Inverter 70 provides a complementary signal LP/FR\on a line 72 (explained infra for the FIG. 6 embodiment).

TABLE 1

| MODE | INPUT/CONNECTION | | | | | OUTPUT |
|---|---|---|---|---|---|---|
| | DEVTYPE\ | 54 | 60 | 64 | 66 | LP/FR |
| NORMAL | X | no | yes | no | yes | DEVTYPE\ |
| LOW POWER | 1 | yes | no | yes | no | 1 (RE ACTIVE) |
| FAST | 0 | yes | no | no | yes | 0 (RE ACTIVE) |

TABLE 1-continued

| MODE | INPUT/CONNECTION | | | | OUTPUT |
|---|---|---|---|---|---|
| | DEVTYPE | 54 | 60 | 64 | 66 | LP/FR |
| REFRESH | | | | | |

The configuration of the FIG. 5 circuit will be explained with reference to Table 1. Circuit 50 is configured in one of three ways: (1) in NORMAL mode where the modification is not used (explained infra); (2) in LOW POWER mode where the device externally appears to the user to be a normal refresh part but actually needs twice as many addresses; and (3) in FAST REFRESH mode where the device appears to the user as a normal device but actually refreshes twice as many addresses.

In the NORMAL mode, circuit 50 of FIG. 5 is configured so that connections 60 and 66 are made and connections 54 and 64 are not made (see TABLE 1). Connection 60 provides a low voltage (VSS) to inverter 52. Inverter 52 will output a high voltage to AND gate 56 thereby permitting the device signal DEVTYPE\to pass. However, the high voltage from inverter 52 will not be applied to inverter 62 because connection 64 is not made (open). Connection 60 is selected to provide a low voltage to one input of OR gate 58; which enables gate 58 to pass device signal DEVTYPE\to inverter 62. Its output signal LP/FR will be dependent on the state of device signal DEVTYPE\.

Device signal DEVTYPE\is preferably supplied by a pad that is not available externally of the device package. The pad is coupled to a high voltage (VCC) or to a low voltage (VSS). A high voltage preferably will make the device a low power device. A low voltage will make the device a fast refresh device. It will be understood that the pad that provides the device signal DEVTYPE\ is preferably set once (hard wired) and cannot be altered by the user. However, any circuit that outputs a signal (LP/FR) responsive to a device entering a refresh mode (signal RE) will suffice.

In the LOW POWER mode, connections 54 and 64 are made, and connections 60 and 66 are not made (open) (see TABLE 1). This circuit configuration causes the output low power/fast refresh signal LP/FR to have a high state. As a result, the memory device requires twice as many addresses as a normal device to refresh. In this mode, only one-half as many memory cells are refreshed to save power by taking advantage of the superior process that allows the data to be retained longer.

In the FAST REFRESH mode, connections 54 and 66 are made, (closed) and connections 60 and 64 are not made (open) (see TABLE 1). This circuit configuration outputs low power/fast refresh signal in a low state to make the device access twice as many addresses on refresh, thus decreasing the refresh time. This configuration takes advantage of the memories that require less power to refresh their devices because of their smaller device dimensions.

Refresh enable signal RE is generated by on-chip circuitry. It signifies, when active, that the memory is to be accessed for refreshing. The generation of refresh enable signal RE can be responsive to refresh modes such as column address strobe before row address strobe (CAS before RAS), stand-by and suspend mode, all known in the art.

Figure 8:
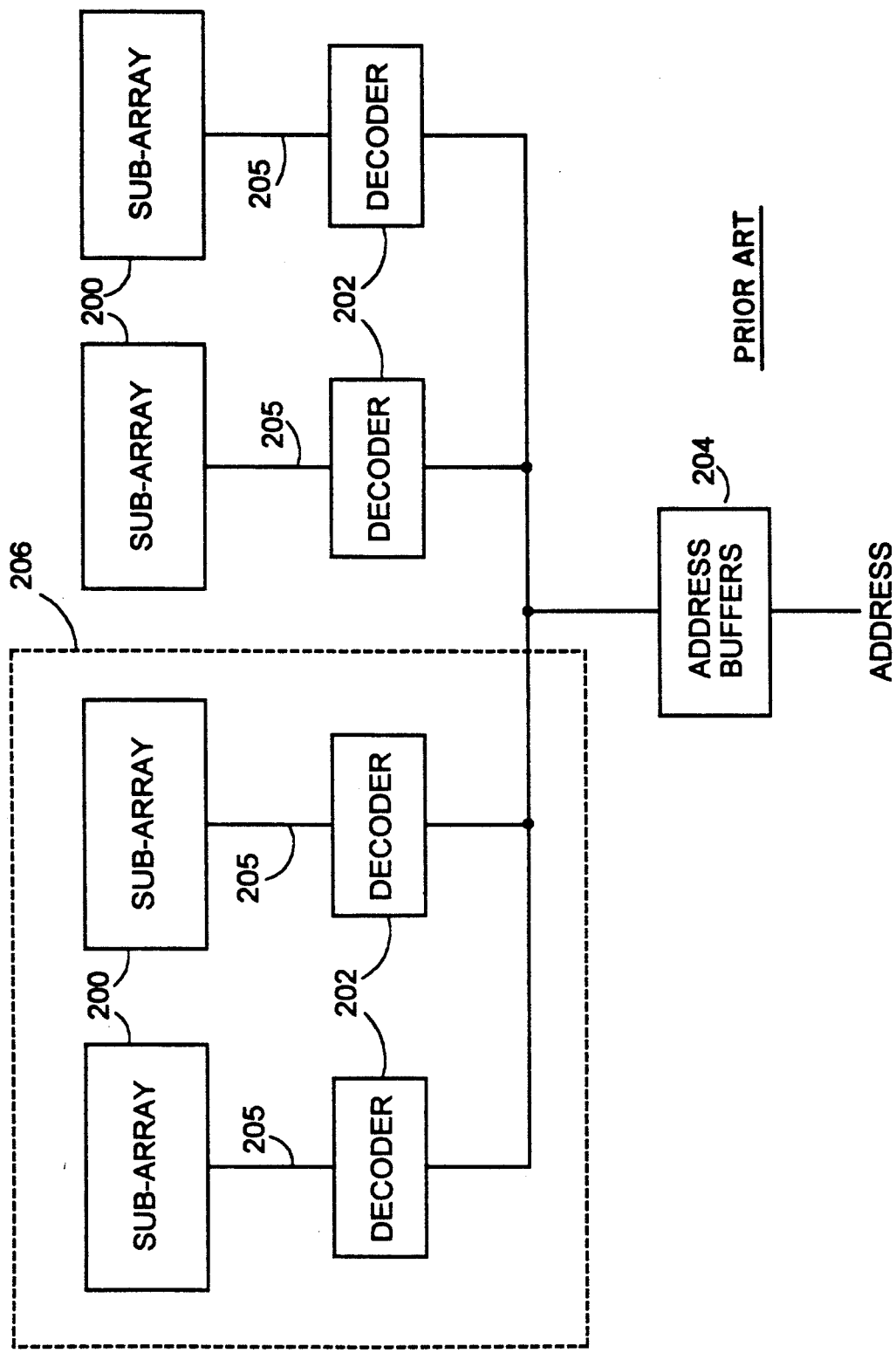
FIG. 8 is a block diagram of subarrays, decoders and address buffers of a conventional memory device.
Figure 9:
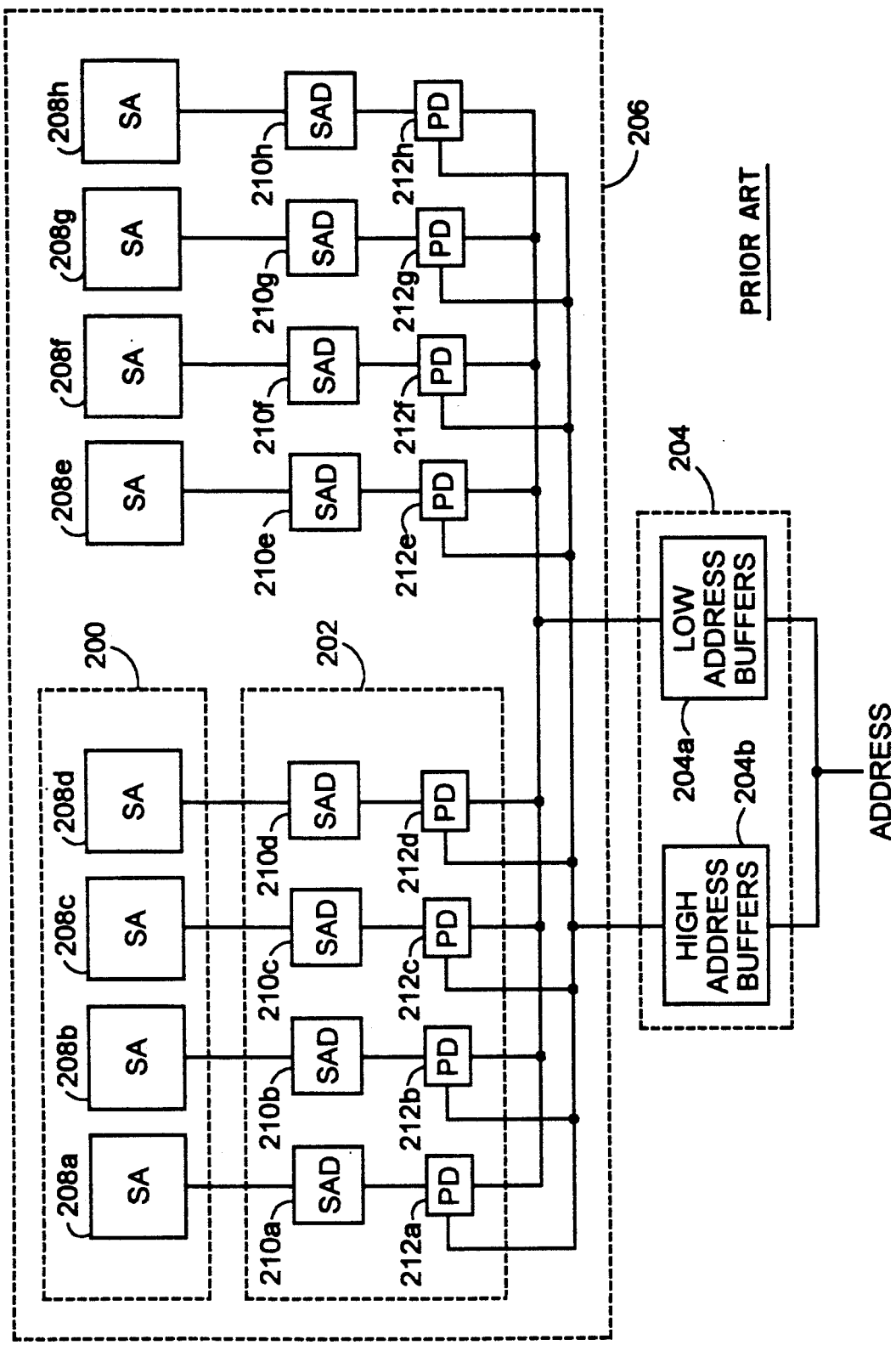
FIG. 9 is a more detailed block diagram of the FIG. 8 diagram.
Figure 10:
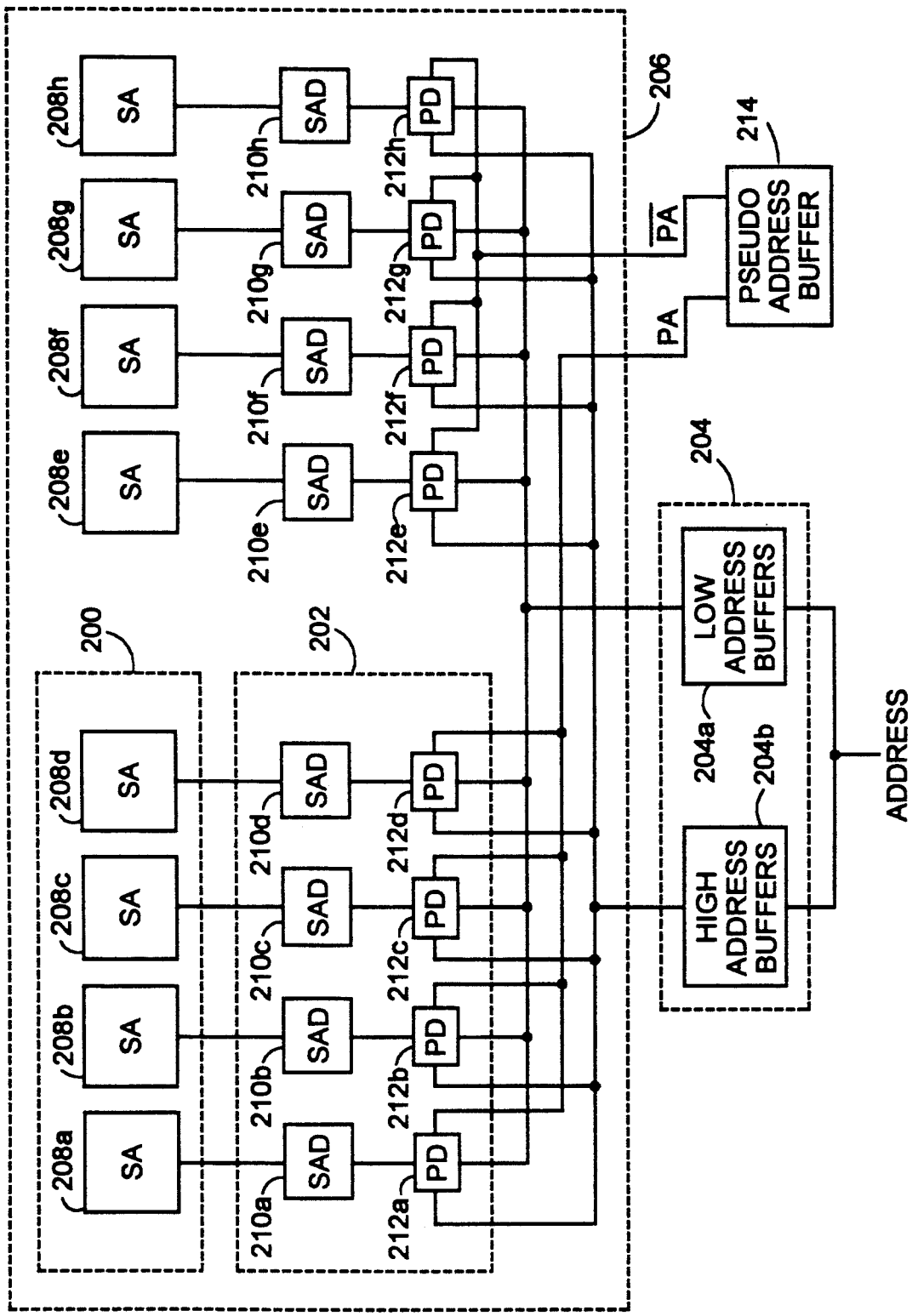
FIG. 10 is block diagram of the FIG. 7 embodiment.

Referring to FIG. 8, the use of FIGS. 4 and 5 will be explained. Assume that the memory depicted in FIG. 8 has sixteen megabits of memory. Each of the subarrays 200 has four megabits of memory, configured as 4,096 rows and 1,024 columns. To access all the rows of each subarray 200, each decoder 202 must provide 4096 row addresses, which translates to a 12 bit address ($2^{12}=4096$).

Figure 7:
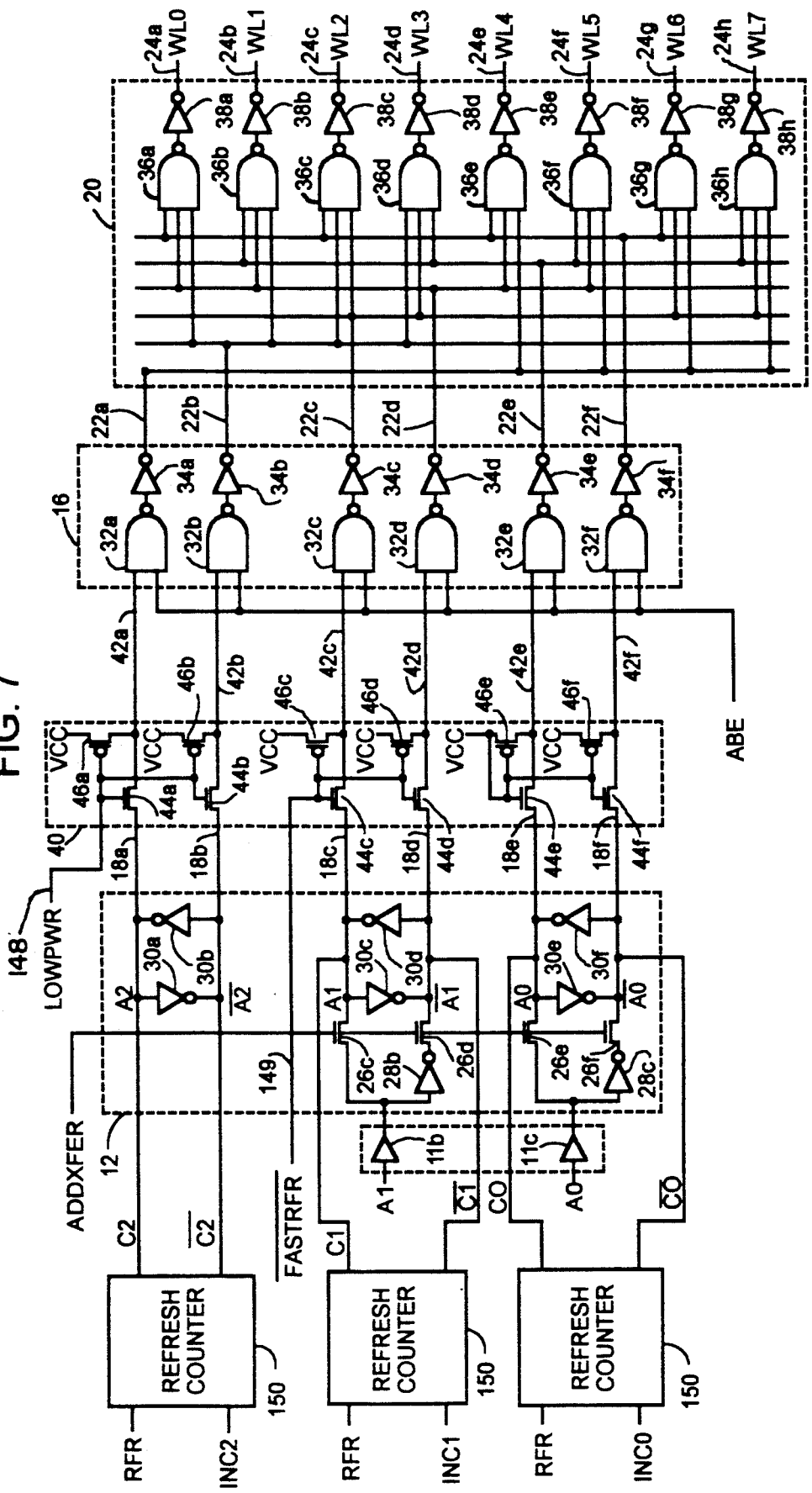
FIG. 7 is a third embodiment of the FIG. 3 diagram.

Due to contemporary memory industry indecision, a sixteen megabit memory device, which uses 24 bits for one memory address memory space, may be provided with some attributes of a 2 or 4 kilobit device. Specifically, the user must provide, when RAS goes low, either an 11-bit or 12-bit row (i.e. word line) address.

Where the memory device receives the 11-bit row address, like a 2 kilobit device, the first eleven row address buffers (for these 11 bits) are configured like the row address buffer for address bit A0 in FIG. 4. The twelfth row address buffer is configured like the address bit buffer for A2 as shown in FIG. 7. The twelfth address bit buffer is preferably not in communication with the external user or system as a row address. It is preferred that the row address buffers be coupled to refresh counters 150 as shown in FIG. 7 for the address buffer for address bit A2.

When the FIG. 5 circuit is set or configured to be in the "normal refresh" mode, signal LP/FR is low (see Table 1). Low signal LP/FR will turn off selection transistors 44a and 44b (FIG. 4) and turn on pull-up transistors 46a and 46b of the twelfth address buffers shown in FIG. 7 to pull up lines 42a, 42b. The two high outputs of the address bit buffer for address bit 12 plus the outputs of the other address bit buffers address two rows in each subarray 200 of FIG. 8. Each block 200 includes a plurality of subarrays so that two rows, for example, can be accessed simultaneously.

When the FIG. 5 circuit is set or configured to be in a "low power refresh" mode, signal LP/FR is high (see Table 1 supra). The twelfth address bit buffer, configured as shown by the address bit buffer for A2 in FIG. 7, has pull-up transistors 46a and 46b turned off and selection transistors 44 and 44 turned on. Now-conductive selection transistors 44a and 44b pass count bit signals C12 and C12\from refresh counter circuit 150 (corresponding to address bit A12) to lines 42a, b. Lines 42a, b will have complementary signals which, along with the other eleven address buffer outputs, will select one respective row in each subarray 200. Since the normal refresh mode caused two rows to be refreshed, only one-half as much power is used when the 16 meg memory using this addressing mode is configured in low power refresh mode than in normal refresh mode.

In the case where the 16 meg memory device receives the same number of row addresses as a 4 kilobit device, the first eleven bit row address buffers are configured like the row address buffer for address bit A0 in FIG. 4. The twelfth row address buffer is configured like the address bit buffer for A2 as shown in FIG. 4. The twelfth address bit buffer is preferably in communication with the external user or system.

When the FIG. 5 circuit is set or configured for the 4-kilobit device, to be in "normal refresh" mode, signal LP/FR is high. The twelfth address bit buffer, configured in the same way as the address bit buffer for A2 in FIG. 4, has the pull-up transistors 46a and 46b turned off and selection transistors 44a and 44b turned on. Turned-on selection transistors 44a and 44b pass a twelfth address bit from the external address pad to lines 42a and 42b. Lines 42a and 42b will have complementary signals. The complementary signals, along with the other eleven address buffers outputs will select one of the rows in each subarray 200.

When the FIG. 5 circuit is set or configured to be in a "fast refresh" mode, signal LP/FR is low (see Table 1). The twelfth address bit buffer, configured in the same way as the address bit buffer for A2 in FIG. 4, has the pull up transistors 46a and 46b turned on and selection transistors 44a and 44b turned off. Turned-on pull-up transistors 46a and 46b pull up lines 42a and 42b toward VCC. Lines 42a and 42b both provide the same signal state, preferably high. These signals, along with the other eleven address buffer outputs, will select two of the rows in each subarray 200. Therefore, one-half as much time is spent refreshing the memory subarrays 200 in FIG. 8 when the memory device receiving the 4K memory row addresses is configured or set in fast refresh mode than in normal refresh mode.

Figure 6:
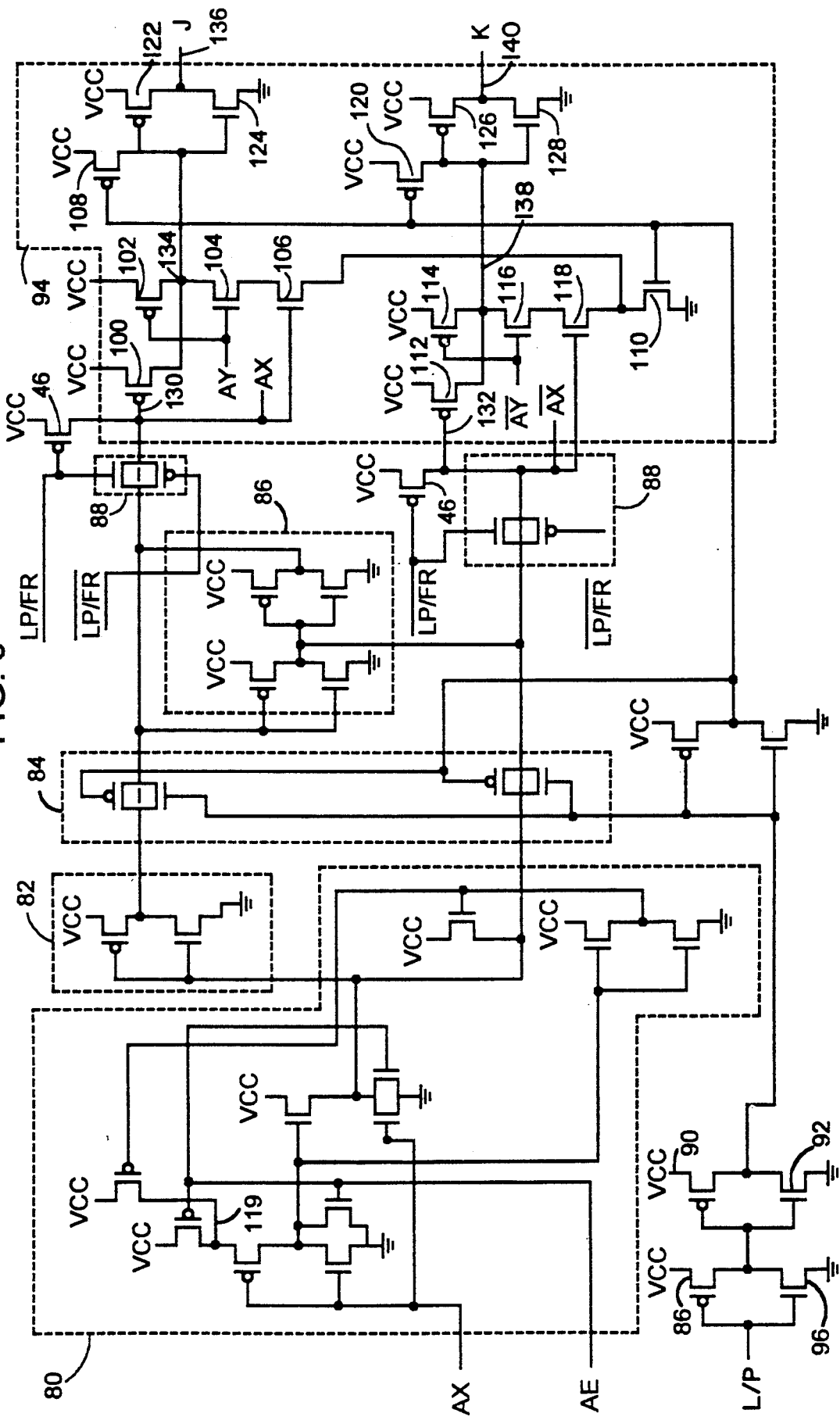
FIG. 6 is a second embodiment of the FIG. 3 diagram.

FIG. 6 shows a second embodiment of the present invention, which illustrates the transistors used to implement the second embodiment. A block 80 represents a transistor implementation of a single address input buffer that is similar to buffer 11a shown in FIG. 4. Block 80 serves to "buffer" or adapt different technologies to one another. For example, a TTL generated input having a high state of 2.4 volts and a low state of 0.8 volts will be converted to a CMOS output having a high state of 5.0 volts and a low state of 0.0 volts.

Block 80 is coupled to receive an address bit AX. It is further coupled to receive an address enable signal AE. Address enable signal AE (active low) becomes active after the address has been allowed time to set up. This set up time insures a valid address input. Active enable signal AE allows the address to be output from block 80.

A block 82 illustrates a transistor implementation of an inverter similar to any of the inverters 28 in FIG. 4. It is coupled to receive the address bit AX output from block 80. Block 80 therefore outputs an inverted address bit AX, and block 82 re-inverts it to provide address bit AX to block 84.

Block 84 is a transistor implementation of pass transistors that function similarly to the pass transistors 26 in FIG. 4. Block 84 includes two n- and p-channel transistor pairs. For each transistor pair, a drain electrode of the n-channel transistor is coupled to a source electrode of the p-channel transistor. A source electrode of the n-channel transistor is coupled to a drain electrode of the p-channel transistor. Gate electrodes of the p-channel transistors are coupled to receive a delayed latch/pass signal L/P. Gate electrodes of the n-channel transistors are coupled to a complement of delayed latch/pass signal L/P. Transistors 90, 92 94 and 96 are used to delay the latch/pass signal L/P before being input to block 84.

These transistor pairs, also known as CMOS pass gates, are used to eliminate the effect that a p- or n-channel threshold voltage has on the address bit AX being passed. If they were not used, then the full voltage value of address bit AX may not pass due to a threshold voltage difference from the gate electrode to the source electrode (n-channel) or the gate electrode to the drain electrode (p-channel).

When the latch/pass signal L/P is high, address bit AX and its complement AX\are output from block 84 to a block 86. Block 86 is a transistor implementation of inverters 30 (shown in FIG. 4) that serve to latch the address bits AX and AX\Block 84 also outputs address bits AX and AX\to blocks 88.

Blocks 88 are transistor implementations of transistors that function similarly to the selection transistors 44 in FIG. 4. Blocks 88 include n- and p-channel transistor pairs where a drain electrode of the n-channel transistor is coupled to a source electrode of the p-channel transistor. A source electrode of the n-channel transistor is coupled to a drain electrode of the p-channel transistor. Gate electrodes of the n-channel transistors are coupled to receive a low power/fast refresh signal LP/FR (generated by the FIG. 5 circuit). Gate electrodes of the p-channel transistors are coupled to a complement of low power/fast refresh signal LP/FR. Low power/fast refresh signal LP/FR is input to gate electrodes of pull-up transistors 46.

Blocks 88 pass address bits AX and AX\to a block 94 when signals LP/FR and LP/FR\ are high and low respectively. Transistors 100, 102, 104, 106, 108 and 110 form a first three-input NAND gate. Transistors 110, 112, 114, 116, 118 and 120 form a second three-input NAND gate. Both NAND gates share transistor 110, but each NAND gate can be implemented with their own transistor equivalent of transistor 110.

The first and second NAND gates function both as NAND gates 32 and inverters 34 of block 16 (as shown in FIG. 4), and NAND gates 36 in block 20 of FIG. 4. Blocks 88 provide address bits AX\and AX to transistors 118 and 106, respectively. Other address bits AY and AY\are respectively input to transistors 104 and 116, hence the function of NAND gates 36 (FIG. 4) is performed. Address bits AY and AY\are provided by another address buffer (not shown).

Delayed latch/pass signal L/P is input to transistor 110 to enable or disable the first and second NAND gates. This provides the function of NAND gates 32 and inverters 34 to pass the address bits to the address decoder circuit 20 as shown in FIG. 4. Transistor pairs 122 and 124, and 126 and 128 are transistor implementations of inverters 34 (shown in FIG. 4.) These inverters invert outputs of the first and second NAND gates to provide pseudo address bits J and K. Pseudo address bits J and K, along with pseudo address bits output from other similarly configured address buffers, are supplied, for example, to another decoder before being supplied to subarrays 200 of FIG. 8.

The operation of the FIG. 6 embodiment will now be explained. An input AX (=0) is input into block 80. Address enable signal becomes active (low) to enable block 80 to pass address bit AX to block 82, which inverts the output of block 80(AX). Block 84 receives address bit AX (0) from block 80. Block 84 receives address bit AX\from block 82. Block 84 passes address bits AX and AX\when delayed latch/pass signal L/P is high to block 86. Block 86 latches the states of address bits AX and AX\

Block 84 also passes address bits AX and AX\to blocks 88 that include the selection transistors. If the variable bit select controller is configured for low power mode, low power/fast refresh signal LP/FR will be high to pass latched address bits AX and AX\to block 94.

If address bits AY and AY\ are respectively 1 and 0, and address bits AX and AX\ are respectively 1 and 0, the following will occur. Address signal AY (=1) is applied to transistor 102 to turn it off, and transistor 104 to turn it on. AX is applied to transistor 100 to turn it on, and transistor 106 to turn it off. Low state latch/pass signal L/P will be delayed and inverted to turn on transistor 110. However, since transistor 106 is off, there is no path between the first power supply source providing supply voltage VCC and a second power supply providing a supply voltage VSS (e.g. ground). Therefore, a line 134 has a high voltage because it is pulled high by transistor 100. The high voltage on line 134 is applied to gate electrodes of transistors 122 and 124. Transistor 122 will be turned off and transistor 124 will be turned on to pull line 136 to a low (VSS) voltage. Pseudo address bit J will therefore be provided in a low state.

Address signal AY\(=0) is applied to transistor\116 to turn it off, and to transistor 114 to turn it on. AX\(=1) is applied to transistor 118 to turn it on, and to transistor 112 to turn it off. Low state latch/pass signal L/P will be delayed and inverted to turn on transistor 110. However, since transistor 116 is off, there is no path between VCC and VSS (e.g. ground). Therefore, a line 138 has a high voltage because it is pulled high by transistor 114. The high voltage on line 138 is applied to gate electrodes of transistors 126 and 128. Transistor 126 will be turned off and transistor 128 will be turned on to pull a line 140 to a low (VSS) voltage. Pseudo address bit K will therefore be provided in a low state.

If the variable bit select controller is configured for fast refresh mode, low power/fast refresh signal LP/FR will be low to block the passing of latched address bits AX and AX\ to block 94. Instead, pull-up transistors 46 will be turned on to pull lines 130 and 132 to a high voltage. Thus, block 94 will be provided with two high inputs as AX and AX\.

If address bits AY\ and AY are respectively 1 and 0, and address bits AX and AX\ are respectively 1 and 1, the following will occur. Address signal AY (=1) is applied to transistor 102 to turn it off, and transistor 104 to turn it on. AX is applied to transistor 100 to turn it off, and transistor 106 to turn it on. Low state latch/pass signal L/P will be delayed and inverted to turn on transistor 110. On transistors 104 and 106 create a path between VSS (e.g. ground) and line 134. Line 134 will be pulled to a low voltage VSS. The low voltage on line 134 is applied to gate electrodes of transistors 122 and 124. Transistor 122 will be turned on and transistor 124 will be turned off to pull line 136 to a high (VCC) voltage. Pseudo address bit J will therefore be provided in a high state.

Address signal AY\(=0) is applied to transistor 116 to turn it off, and transistor 114 to turn it on. AX\(=1) is applied to transistor 118 to turn it on, and transistor 112 to turn it off. Low state latch/pass signal L/P will be delayed and inverted to turn on transistor 110. However, since transistor 116 is off, there is no path between VCC and VSS (e.g. ground). Therefore, on line 138 has a high voltage because it is pulled high by on transistor 114. The high voltage on line 138 is applied to gate electrodes of transistors 126 and 128. Transistor 126 will be turned off and transistor 128 will be turned on to pull line 140 to a low (VSS) voltage. Pseudo address bit K will therefore be provided in a low state.

Latch/pass signal L/P preferably functions as both address transfer signal ADDXFER and address buffer enable signal ABE (shown in FIG. 4).

The FIG. 6 circuit can be replicated for a multiple-bit address signal. Or it can replace one or more address buffers in a conventional row address circuit.

A third embodiment of the present invention will be explained by referring to FIG. 7. As can be seen, FIG. 7 is a modification of the FIG. 4 embodiment. The modification includes decoupling the gate electrodes of selection transistors 44c and 44d, and pull-up transistors 46c and 46d from the power supply voltage VCC. The gate electrodes of selection transistors 44c and 44d, and pull-up transistors 46c and 46d are coupled to a line 149 to receive a signal FASTRFR\. Line 148 provides a signal LOWPWR to the gate electrodes of transistors 44a, 44b, 46a and 46b.

The FIG. 7 embodiment allows for three modes of operation. In normal refresh mode, signal LOWPWR is preferably low to disable the A2 buffer by blocking the passage of count bits C2 and C2\ to the address decoder circuit 20. Pull-up transistors 46a will be turned on to supply high voltages on lines 42a and 42b. Signal FASTRFR\ will be high to enable the A1 buffer to pass address bits A1 and A1\ to the address decoder circuit 20. As can be determined from the FIG. 7 embodiment, in normal mode two of the word line signals WL0-7 will be active.

In low power mode, signal LOWPWR is preferably high to enable the A2 buffer to pass count bits C2 and C2\ to the address decoder circuit 20. Signal FASTRFR\ will be high to enable the A1 buffer to pass address bits A1 and A1\ to the address decoder circuit 20. As can be determined from the FIG. 7 embodiment if address signal A0-A2 is 1, 0, 1, then enabling signal WL5 will be active in low power mode.

In fast refresh mode, signal LOWPWR is preferably low to disable the A2 buffer by blocking the passage of count bits C2 and C2\ to the address decoder circuit 20. Pull-up transistors 46a and 46b will be turned on to supply high voltages on lines 42a and 42b. Signal FASTRFR\ will be low to address A1 buffer by blocking the passage of count bits C1 and C1\ to the address decoder circuit 20. Pull-up transistors 46c and 46d will be turned on to supply high voltages on lines 42c and 42d. As can be determined from the FIG. 7 embodiment, if address signal A0-A2 is 1, 0, 1, enabling signals WL1, WL3, WL5 and WL7 will be active in fast refresh mode.

It should be understood that in normal refresh mode, either signal FASTRFR\ or LOWPWR is high, while the other signal is low. Either address bits A1, A1\ or A2, A2\ will be blocked while the other address bits are passed.

Figure 11:
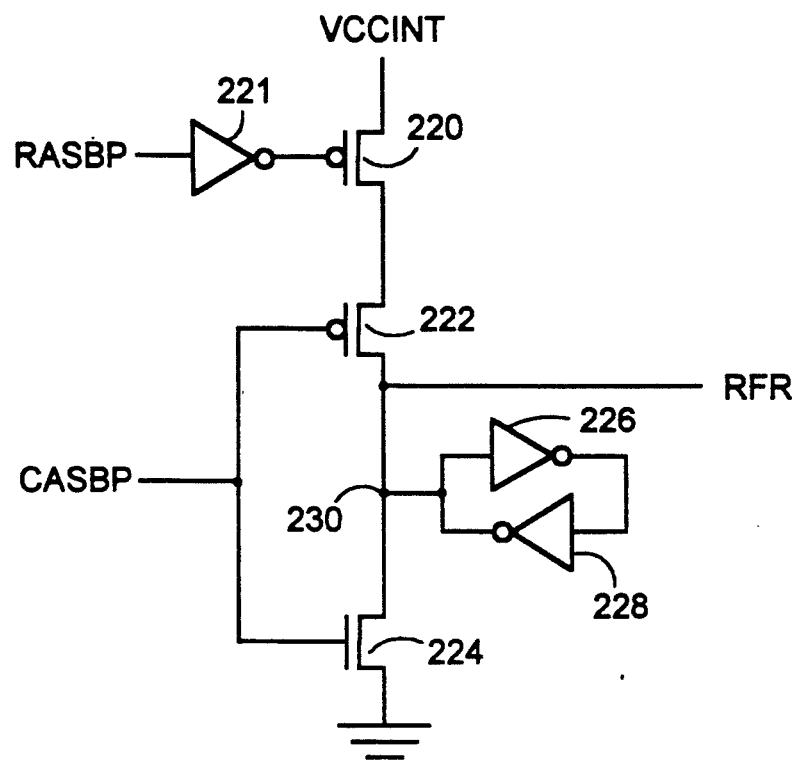
FIG. 11 is a detailed schematic of a refresh signal circuit generator.
Figure 12:
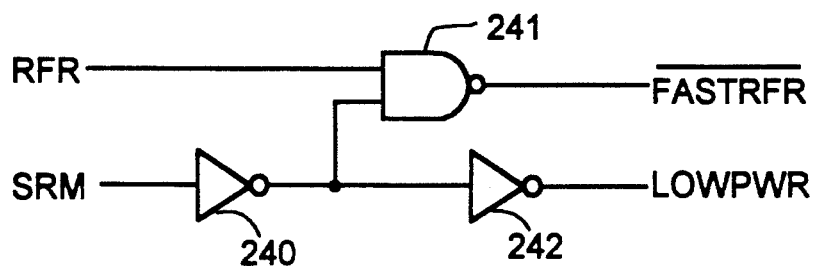
FIG. 12 is a detailed schematic of a fast refresh and low power signals generator.

Referring to FIG. 11, signals LOWPWR and FASTRFR\ are generated by a circuit shown in FIG. 12 which is preferably responsive to the refresh mode of the memory device. The circuit may also be responsive to signals generated on-chip by the user, or hard wired, that control whether the device is in low power, normal or fast refresh mode.

FIG. 11 will be referred to first to explain the generation of signals FASTRFR\ and LOWPWR. Source-drain paths of transistors 220, 222 and 224 are coupled in series between a power supply providing a voltage VCCINT and another power supply providing, for example, VSS (e.g. ground). A gate electrode of transistor 220 is coupled to receive a buffered row address strobe ("RAS") pad signal RASBP. Gate electrodes of transistors 222 and 224 are coupled to receive a buffered column address strobe ("CAS") pad signal CASBP. Cross-coupled inverters 226 and 228 have a terminal coupled to a node 230. Node 230 provides a refresh signal RFR.

The circuit of FIG. 11 generates refresh signal RFR when signals CASBP is low and RASBP is high. Inverter 221 inverts signal RASBP to supply a low signal to transistor 220. Transistors 220 and 222 will be turned on to provide voltage VCC to node 230. Transistor 224 will be turned off to decouple node 230 from ground. Refresh signal RFR will be provided from node 230 in a high state.

FIG. 12 illustrates a circuit for generating signals LOWPWR and FASTRFR\ Inverters 240 and 242 are coupled in series. Inverter 240 is coupled to receive a self-refresh mode signal SRM. Self-refresh mode signal SRM is generated (active high) by a circuit (not shown) in response to CAS before RAS, which are then maintained preferably low for 100 μsec. An output terminal of inverter 242 provides signal LOWPWR.

A logic gate 241, preferably a NAND gate, is coupled to an output terminal of inverter 240. NAND gate 241 is also coupled to receive refresh signal RFR from the FIG. 11 circuit. An output terminal of NAND gate 241 provides signal FASTRFR\.

Table 2 shows the corresponding inputs and outputs of the FIG. 12 circuit.

TABLE 2

| RFR | SRM | FASTRFR\ | LOWPWR |
|-----|-----|----------|--------|
| 0 | 0 | 1 | 0 |
| 0 | 1 | 1 | 1 |
| 1 | 0 | 0 | 0 |
| 1 | 1 | 1 | 1 |

Figure 13:
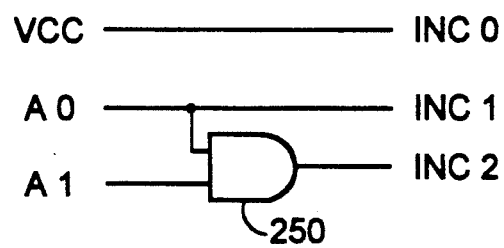
FIG. 13 is a detailed schematic of an increment signal generator.

Refresh counters 150 shown in FIG. 7 are coupled to receive refresh signal RFR from the FIG. 11 circuit. Refresh counters 150 also are coupled to receive increment signals INCX, where X equals the number of the address buffer receiving the count bit signal. Signals INCX are provided by a circuit as shown in FIG. 13. As shown in FIG. 13, there are provided signals INC0, INC1 and INC2. Signal INC0 is preferably provided from the voltage VCC. Signal INC1 is preferably provided from the output of the address buffer for A0. Signal INC2 is provided from an output terminal of a logic gate 250, preferably an AND gate. Logic gate 250 is coupled to receive address bits A0 and A1. Address bit A1 is provided from the output of the address buffer for A1.

Figure 14:
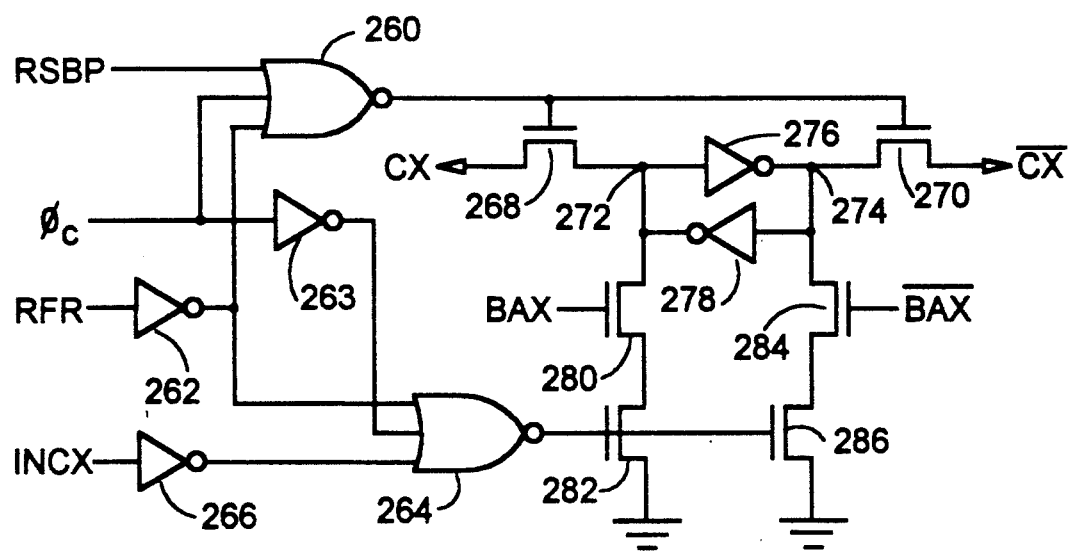
FIG. 14 is a detailed diagram of a counter circuit.

FIG. 14 shows a preferred detailed schematic of a refresh counter 150 shown in FIG. 7. A logic gate 260, preferably a NOR gate, is coupled to receive signals RASBP, a clock signal Φ$_c$ through inverter 263 and an output of an inverter 262. Inverter 262 is coupled to receive signal RFR from the circuit of FIG. 11. Clock signal Φ$_c$\ starts out low and then goes high after a row address is latched. A logic gate 264 is coupled to receive an output of inverter 262, an inverted clock signal Φ$_c$, through inverter 263 and an output of an inverter 266. Inverter 266 is coupled to receive an increment signal INCX, where X corresponds to the address bit buffer to which the circuit of FIG. 14 is coupled. In other words, the number of FIG. 14 circuits equals the number of address buffers.

An output of logic gate 260 is coupled to gate electrodes of transistors 268 and 270. A source-drain path of transistor 268 is coupled between a node 272 and a terminal providing count bit signal CX. A source-drain path of transistor 270 is coupled between a node 274 and a terminal providing complementary count bit signal CX\. Coupled between nodes 272 and 274 are cross-coupled inverters 276 and 278.

Source-drain paths of transistors 280 and 282 are coupled in series between node 272 and preferably ground. A gate electrode of transistor 280 is coupled to receive a buffered address bit BAX. BAX is the output of the buffer for the AX address bit. A gate electrode of transistor 282 is coupled to an output of NOR gate 264.

Source-drain paths of transistors 284 and 286 are coupled in series between node 274 and preferably ground. A gate electrode of transistor 284 is coupled to receive a buffered complementary address bit BAX\. BAX\ is the output of the address buffer for the AX address bit. A gate electrode of transistor 286 is coupled to an output of NOR gate 264.

Signals RASBP and RFR enable the circuit of FIG. 14 to output count bits CX and CX\ and to be incremented if necessary. When the user or system enters a refresh mode, signals RASBP and RFR are low and high, respectively. Signal Φ$_c$ starts out low to latch signals CX and CX\ into their corresponding address buffer. The latching is done when logic gate 260 receives all low input signals. Logic gate 260 then outputs a high signal. This high signal is supplied to the gate electrodes of transistors 268 and 270 to turn them on. These turned on transistors supply to the corresponding address buffer voltages at nodes 272 and 274. For example, when the voltage value at node 272 is high, then one of the uncomplemented lines 18a, 18c or 18e in FIG. 7 is set to a high voltage. Since node 274 has a voltage value that is the complement of the node 272 voltage, one of the complemented lines 18b, 18d or 18f is set to a low voltage through turned-on transistor 274. This setting of lines 18 occurs every refresh cycle.

When signal Φ$_c$ (FIG. 14) transitions to a high state, logic gate 260 outputs a low signal, which turns off transistors 268 and 270, thereby to decouple nodes 272 and 274 from their corresponding lines 18 coupled to CX and CX. High signal Φ$_c$ also enables logic gate 264 to be responsive to signal INCX. If signal INCX is high, and the system is in refresh mode, and signal Φ$_c$ is high, then an output of logic gate 264 will be high. Transistors 282 and 286 will be turned on. Because signals BAX and BAX\ are complements of each other, one of transistors 280 and 284 will be turned on. Then either node 272 or node 274 is coupled to ground through transistors 280 and 282 or turned-on transistors 284 and 286, respectively, to complement its corresponding address bit AX or AX\.

If signal INCX is low, then the output of logic gate 264 is low. Neither transistor 282 nor 286 is turned on. Nodes 272 and 274 will not be coupled to ground, and the address bit AX will not be complemented. The above-explained steps of the FIG. 14 counter circuit are repeated every time the memory array is to be refreshed.

Each substitution of a variable bit select circuit, such as the FIG. 6 embodiment, for an address buffer will either increase the fast refresh by a factor of two, or decrease the low power refresh by a factor of two.

To simplify the foregoing descriptions, when a device having the present invention substituted for one address buffer is configured to be in a low power mode, the address buffer is enabled i.e. the address bit and its complements are allowed to pass from the buffers latch circuit 12 (in FIG. 3) to the address decoder circuit 20 (in FIG. 3). This allows the device to refresh only one-half of the addresses of the memory to save power.

When a device having a circuit according to the present invention substituted for one address buffer is configured to be in a fast refresh mode, the address buffer is disabled, i.e. the address bit and its complement are not allowed to pass from the buffers latch circuit 12 (in FIG. 3) to the address decoder circuit 20 (in FIG. 3). Instead, the variable bit select circuit provides address bit and its complement both in a high state. This allows the device to refresh twice as fast as in normal mode.

The FIGS. 4 and 7 embodiments illustrate the present invention for a three-bit address, but may be used for an address having more bits.

Since the select variable address select circuit controller and the selection transistor/pull-up transistor configuration (block/pass elements) require few logic gates and transistors, the present invention is implemented using a small amount of chip area.

It will be understood that the present invention allows at least one input address bit and its complement to be blocked, regardless of the device implementation that inputs them. For example, an internal refresh counter may provide refresh row address bits directly to inverters 30 of FIG. 4. This counter would be responsive, for example, to refresh signal RE. Address transfer signal ADDXFER would be disabled. The present invention provides to the address decoder circuit, instead of the blocked address bits, bit values that are active. Thus the decoder, which normally receives an address bit and its complement, receives both bits active.

The circuitry that blocks or passes the address bits may be configured differently from the selection transistor/pull-up transistor configuration (block/pass elements). Any circuit that blocks at least one address bit and/or its complements, and provides a bit value in its place, may be used without parting from the spirit or scope of the present invention.

It should be appreciated that the foregoing description is directed to a preferred embodiment of the present invention, and that numerous modifications or alterations can be made without departing from the spirit or scope of the present invention.

What I claim as the invention is:

1. A bit select circuit for an integrated circuit comprising:
   a variable bit select circuit having inputs coupled to receive a plurality of address bits and a control signal, and having an output, at least one of the address bits being blocked or passed depending on said control signal; and
   an address decoder coupled to receive said output of said variable bit select circuit to enable access to memory data.

2. The circuit of claim 1 further comprising an address latch coupled to receive and latch said address bits, and to provide the address bits to said variable bit select circuit.

3. The circuit of claim 1 further comprising an output enable circuit coupled to receive the output of said variable bit select circuit and an address output enable signal, wherein said output enable circuit passes said output of said variable bit select circuit to said address decoder in response to the address output enable signal.

4. The circuit of claim 1 wherein when one of said address bits is blocked, said variable bit select circuit substitutes an active signal for the at least one blocked address bit.

5. The circuit of claim 1 wherein said variable bit select circuit includes at least one block/pass element coupled to receive the at least one address bit and the control signal, wherein the at least one block/pass element blocks or passes the at least one address bit in response to the control signal.

6. The circuit of claim 1 further comprising a variable bit select controller coupled to receive a controller enable signal and coupled to the variable bit select circuit, said variable bit select controller providing at least one block/pass control signal to said variable bit select circuit in response to the controller enable signal.

7. The circuit of claim 5 wherein the at least one block/pass element includes a selection transistor and a pull-up transistor each having a respective control electrode and a source-drain path, the control electrodes of the selection and pull-up transistors being coupled to said control signal, a source-drain path of the selection transistor being coupled to receive the at least one address bit and being coupled to an output line, said at least one address bit being selectively coupled to the output line in response to a first state of the control signal, the source-drain path of the pull-up transistor being coupled to a power supply and to the output line, and selectively coupling the power supply to the output line in response to a second state of the control signal.

8. A bit select circuit for a memory comprising:
   a plurality of address buffers coupled to receive a plurality of address bits including a variable bit select circuit coupled to receive at least one of the plurality of address bits and a control signal to provide an address buffer output, the at least one of the address bits being blocked or passed in response to said control signal; and
   an address decoder coupled to receive said address buffer output to enable access to memory data.

9. The circuit of claim 8 wherein said variable bit select circuit includes at least one block/pass element coupled to receive the at least one address bit and the control signal, wherein the at least one block/pass element blocks or passes the at least one address bit in response to the control signal.

10. The circuit of claim 8 wherein said variable bit select circuit substitutes an active signal for the at least one blocked address bit.

11. The circuit of claim 8 wherein said bit select circuit constitutes a row address buffer circuit of a memory.

12. The circuit of claim 9 wherein the at least one block/pass element includes a selection transistor and a pull-up transistor each having a respective control electrode and a source-drain path, the control electrodes of the selection and pull-up transistors being coupled to said control signal, a source-drain path of the selection transistor being coupled to receive the at least one address bit and being coupled to an output line, said at least one address bit being selectively coupled to the output line in response to a first state of the control signal, the source-drain path of the pull-up transistor being coupled to a power supply and to the output line and selectively coupling the power supply to the output line in response to a second state of the control signal.

13. The circuit of claim 8 further comprising a variable bit select controller coupled to receive at least one controller enable signal, the variable bit select controller being coupled to the variable bit select circuit, said variable bit select controller providing said control signal to said variable bit select circuit in response to the at least one controller enable signal.

14. A bit select circuit for an integrated circuit comprising:

a buffer circuit coupled to receive a plurality of address bits;

a buffer latch circuit coupled to receive an output of said buffer circuit;

a variable bit select circuit coupled to receive an output of said buffer latch circuit;

a buffer output enable circuit coupled to receive an output of said variable bit select circuit; and an address decoder circuit coupled to receive an output of said buffer output enable circuit and to provide an output that enables access to memory data in response to the output of said variable bit select circuit.

15. The circuit of claim 14 wherein said variable bit select circuit includes a variable bit select controller coupled to receive at least one signal that corresponds to a refresh mode of a memory device, and provides to said variable bit select circuit a control signal when the memory device is in the refresh mode.

16. A variable bit select circuit comprising:

at least one selection transistor having a control electrode and a source-drain path, the control electrode of said selection transistor being coupled to a control signal, the source-drain path of the selection transistor being coupled to receive at least one address bit and being coupled to an output line, the at least one address bit being selectively coupled to the output line in response to a first state of the control signal; and at least one pull-up transistor having a control electrode and a source-drain path, the control electrode of the pull-up transistor being coupled to said control signal, the source-drain path of the pull-up transistor being coupled to receive a power supply signal and to the output line, and selectively coupling said power supply signal to the output line in response to a second state of the control signal.

17. The circuit of claim 16 further comprising:

an address buffer coupled to receive the at least one address bit and coupled to said at least one selection transistor; and a decoder circuit coupled to the output line to provide a decoded output.

18. A method of controlling the output of an address circuit comprising the steps of:

passing all address bits in response to a first state of a control signal;

blocking at least one of the address bits in response to a second state of the control signal; and substituting a signal for any of said blocked address bits.

19. The method of claim 18 further comprising the steps of:

buffering and latching said address bits prior to said passing or blocking steps;

decoding said passed or substituted address bits into an address; and accessing memory cells that correspond to the decoded address.

* * * * *